(12) United States Patent
Slesazeck et al.

(10) Patent No.: US 7,738,279 B2
(45) Date of Patent: Jun. 15, 2010

(54) INTEGRATED CIRCUIT AND METHOD OF OPERATING AN INTEGRATED CIRCUIT

(75) Inventors: Stefan Slesazeck, Dresden (DE); Till Schloesser, Dresden (DE); Ulrike Gruening-Von Schwerin, Munich (DE)

(73) Assignee: Qimonda AG, Munich (DE)

( * ) Notice: Subject to any disclaimer, the term of this patent is extended or adjusted under 35 U.S.C. 154(b) by 82 days.

(21) Appl. No.: 12/131,802

(22) Filed: Jun. 2, 2008

(65) Prior Publication Data

US 2009/0296449 A1    Dec. 3, 2009

(51) Int. Cl.
*G11C 11/00* (2006.01)
(52) U.S. Cl. ........................... 365/148; 365/104; 365/63
(58) Field of Classification Search ................. 365/148, 365/49, 104, 63; 355/148, 49, 104, 63
See application file for complete search history.

(56) References Cited

U.S. PATENT DOCUMENTS

| 6,379,978 | B2 | 4/2002 | Goebel et al. |
|---|---|---|---|
| 7,359,226 | B2 * | 4/2008 | Schwerin .................... 365/49.1 |
| 7,489,008 | B1 * | 2/2009 | Lee et al. ..................... 257/347 |
| 7,599,209 | B2 * | 10/2009 | Hoenigschmid et al. .... 365/148 |
| 2003/0128580 | A1 | 7/2003 | Park et al. |
| 2004/0027907 | A1 | 2/2004 | Ooishi |
| 2004/0174756 | A1 | 9/2004 | Kunikiyo et al. |
| 2006/0067112 | A1 | 3/2006 | Ferrant et al. |
| 2006/0279985 | A1 | 12/2006 | Keshavarzi et al. |
| 2007/0058427 | A1 | 3/2007 | Okhonon et al. |
| 2008/0203469 | A1 | 8/2008 | Gruening-Von Schwerin |
| 2008/0253179 | A1 | 10/2008 | Slesazeck |
| 2009/0168493 | A1 * | 7/2009 | Kim et al. ................... 365/148 |

FOREIGN PATENT DOCUMENTS

| DE | 101 64 283 A1 | 8/2002 |
|---|---|---|
| DE | 10 2005 046 426 A1 | 4/2006 |
| DE | 10 2007 015 540 A1 | 9/2008 |
| EP | 1 329 895 A2 | 7/2003 |

* cited by examiner

*Primary Examiner*—Connie C Yoha (57) ABSTRACT

According to one embodiment of the present invention, an integrated circuit is provided including a plurality of resistivity changing memory elements and a plurality of memory element select devices, wherein the select devices are floating body select devices.

20 Claims, 7 Drawing Sheets

INTEGRATED CIRCUIT AND METHOD OF OPERATING AN INTEGRATED CIRCUIT

BACKGROUND

Integrated circuits including resistivity changing memory cells are known. It is desirable to provide further architectures of such integrated circuits.

SUMMARY OF THE INVENTION

According to one embodiment of the present invention, an integrated circuit is provided including a plurality of resistivity changing memory elements and a plurality of memory element select devices, wherein the select devices are floating body select devices According to one embodiment of the present invention, a method of operating an integrated circuit including a plurality of resistivity changing memory elements and a plurality of memory element select devices is provided, the select devices being floating body select devices, the method including: applying a voltage drop across a select device such that the select device switches from a non-conductive mode into a conductive mode; and reading the memory state or writing the memory state of a memory element assigned to the select device after having switched the select device into the conductive mode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Since the embodiments of the present invention can be applied to magneto-resistive memory devices which include resistivity changing memory cells (magneto-resistive memory cells), a brief discussion of magneto-resistive memory devices will be given.

Figure 1:
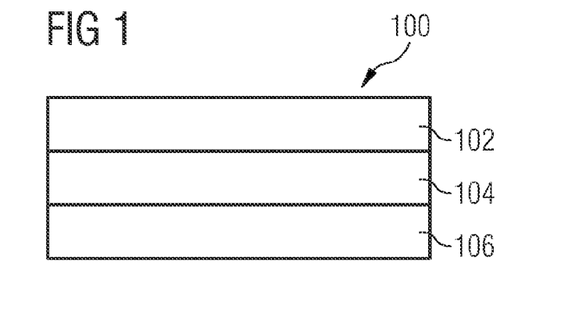
FIG. 1 shows a schematic cross-sectional view of a magneto-resistive memory element.

Magneto-resistive memory devices involve spin electronics, i.e., involve a combination of semiconductor technology and magnetics. FIG. 1 shows an embodiment of a magneto-resistive memory element 100 having a soft layer 102, a tunnel layer 104, and a hard layer 106. The soft layer 102 and the hard layer 106 preferably respectively include a plurality of magnetic metal layers, for example, eight to twelve layers of materials such as PtMn, CoFe, Ru, and NiFe, or the like. A logic state is represented by the directions of magnetizations of the soft layer 102 and the hard layer 106.

Figure 2:
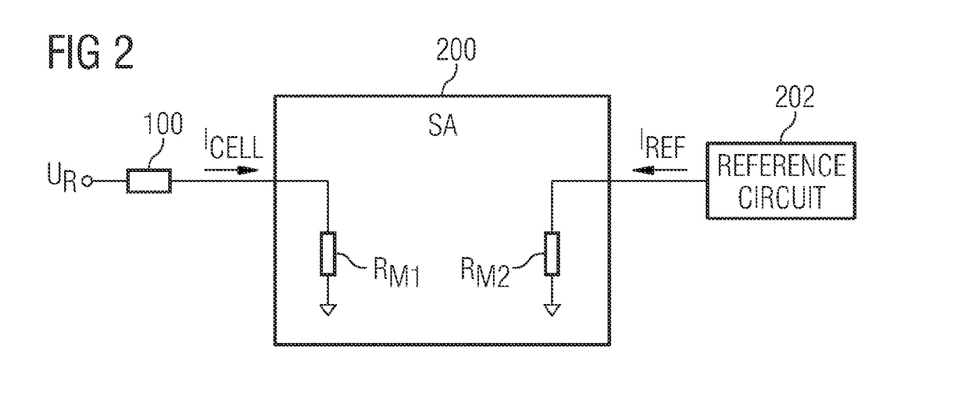
FIG. 2 shows an integrated circuit usable in conjunction with the memory element shown in FIG. 1.

In order to read the logic state stored within the memory element 100, a schematic such as the one shown in FIG. 2, including a sense amplifier (SA) 200, is used. A reference voltage $U_R$ is applied to one end of a memory element 100. The other end of the memory cell 100 is coupled to a measurement resistor $R_{m1}$. The other end of the measurement resistor $R_{m1}$ is coupled to ground. The current running through the memory element 100 is equal to current $I_{cell}$. A reference circuit 202 supplies a reference current $I_{ref}$ that is run into measurement resistor $R_{m2}$. The other end of the measurement resistor $R_{m2}$ is coupled to ground, as shown.

Since the embodiments of the present invention can be applied to programmable metallization cell devices (PMC) (e.g., solid electrolyte devices like CBRAM (conductive bridging random access memory) devices), in the following description, making reference to FIGS. 3A and 3B, a basic principle underlying embodiments of CBRAM devices will be explained.

Figure 3A:
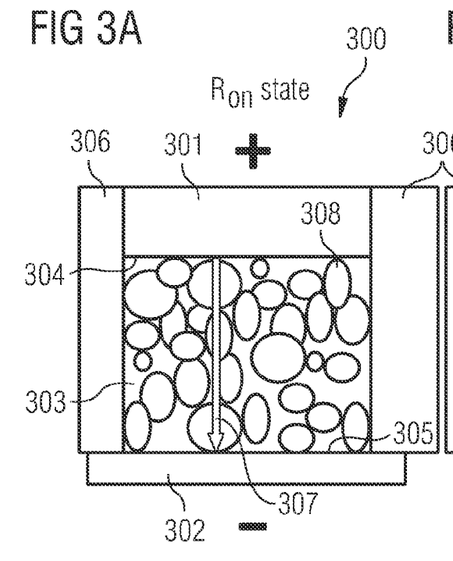
FIG. 3A shows a schematic cross-sectional view of a programmable metallization memory element set to a first switching stage.
Figure 3B:
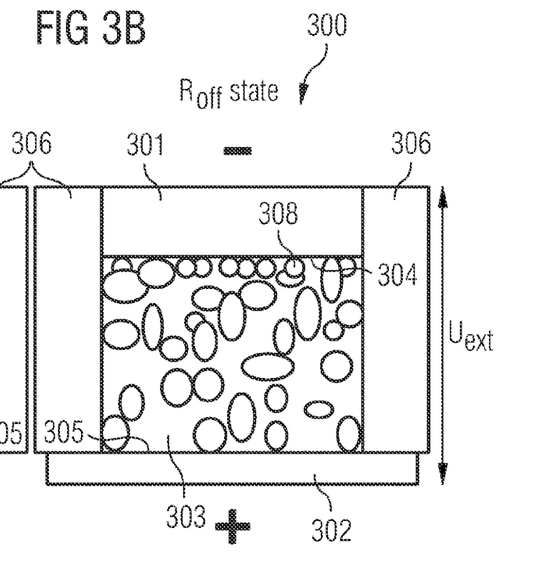
FIG. 3B shows a schematic cross-sectional view of a programmable metallization memory element set to a second switching state.

As shown in FIG. 3A, a CBRAM element 300 includes a first electrode 301, a second electrode 302, and a solid electrolyte block (in the following also referred to as ion conductor block) 303 which includes the active material and which is sandwiched between the first electrode 301 and the second electrode 302. This solid electrolyte block 303 can also be shared between a plurality of memory elements (not shown here). The first electrode 301 contacts a first surface 304 of the ion conductor block 303, the second electrode 302 contacts a second surface 305 of the ion conductor block 303. The ion conductor block 303 is isolated against its environment by an isolation structure 306. The first surface 304 usually is the top surface, the second surface 305 the bottom surface of the ion conductor 303. In the same way, the first electrode 301 generally is the top electrode, and the second electrode 302 the bottom electrode of the CBRAM element. One of the first electrode 301 and the second electrode 302 is a reactive electrode, the other one an inert electrode. Here, the first electrode 301 is the reactive electrode, and the second electrode 302 is the inert electrode. In this example, the first electrode 301 includes silver (Ag), the ion conductor block 303 includes silver-doped chalcogenide material, the second electrode 302 includes tungsten (W), and the isolation structure 306 includes $SiO_2$ or $Si_3N_4$. The present invention is however not restricted to these materials. For example, the first electrode 301 may alternatively or additionally include copper (Cu) or zinc (Zn), and the ion conductor block 303 may alternatively or additionally include copper-doped chalcogenide material. Further, the second electrode 302 may alternatively or additionally include nickel (Ni) or platinum (Pt), iridium (Ir), rhenium (Re), tantalum (Ta), titanium (Ti), ruthenium (Ru), molybdenum (Mo), vanadium (V), conductive oxides, silicides, and nitrides of the aforementioned materials, and can also include alloys of the aforementioned materials. The thickness of the ion conductor 303 may, for example, range between about 5 nm and about 500 nm. The thickness of the first electrode 301 may, for example, range between about 10 nm and about 100 nm. The thickness of the second electrode 302 may, for example, range between about 5 nm and about 500 nm, between about 15 nm to about 150 nm, or between about 25 nm and about 100 nm. It is to be understood that the present invention is not restricted to the above-mentioned materials and thicknesses.

In the context of this description, chalcogenide material (ion conductor) is to be understood, for example, as any compound containing oxygen, sulphur, selenium, germanium and/or tellurium. In accordance with one embodiment of the invention, the ion conducting material is for example a compound, which is made of a chalcogenide and at least one metal of the group I or group II of the periodic system, for example, arsenic-trisulfide-silver. Alternatively, the chalcogenide material contains germanium-sulfide ($GeS_x$), germanium-selenide ($GeSe_x$), tungsten oxide ($WO_x$), copper sulfide ($CuS_x$) or the like. The ion conducting material may be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

If a voltage as indicated in FIG. 3A is applied across the ion conductor block 303, a redox reaction is initiated which drives $Ag^+$ ions out of the first electrode 301 into the ion conductor block 303 where they are reduced to Ag, thereby forming Ag rich clusters 308 within the ion conductor block 303. If the voltage applied across the ion conductor block 303 is applied for an enhanced period of time, the size and the number of Ag rich clusters within the ion conductor block 303 is increased to such an extent that a conductive bridge 307 between the first electrode 301 and the second electrode 302 is formed. In case that a voltage is applied across the ion conductor 303 as shown in FIG. 3B (inverse voltage compared to the voltage applied in FIG. 3A), a redox reaction is initiated which drives $Ag^+$ ions out of the ion conductor block 303 into the first electrode 301 where they are reduced to Ag. As a consequence, the size and the number of Ag rich clusters within the ion conductor block 303 is reduced, thereby erasing the conductive bridge 307. After having applied the voltage/inverse voltage, the memory element 300 remains within the corresponding defined switching state even if the voltage/inverse voltage has been removed.

In order to determine the current memory status of a CBRAM element, for example, a sensing current is routed through the CBRAM element. The sensing current experiences a high resistance in case no conductive bridge 307 exists within the CBRAM element, and experiences a low resistance in case a conductive bridge 307 exists within the CBRAM element. A high resistance may, for example, represent "0", whereas a low resistance represents "1", or vice versa. The memory status detection may also be carried out using sensing voltages. Alternatively, a sensing voltage may be used in order to determine the current memory status of a CBRAM element.

Since the embodiments of the present invention can be applied to phase change memory devices, in the following description, a basic principle underlying embodiments of PCRAM devices will be explained.

According to one embodiment of the invention, the resistivity changing memory elements are phase change memory elements that include a phase change material. The phase change material can be switched between at least two different crystallization states (i.e., the phase change material may adopt at least two different degrees of crystallization), wherein each crystallization state may be used to represent a memory state. When the number of possible crystallization states is two, the crystallization state having a high degree of crystallization is also referred to as a "crystalline state", whereas the crystallization state having a low degree of crystallization is also referred to as an "amorphous state". Different crystallization states can be distinguished from each other by their differing electrical properties, and in particular by their different resistances. For example, a crystallization state having a high degree of crystallization (ordered atomic structure) generally has a lower resistance than a crystallization state having a low degree of crystallization (disordered atomic structure). For the sake of simplicity, it will be assumed in the following that the phase change material can adopt two crystallization states (an "amorphous state" and a "crystalline state"), however it will be understood that additional intermediate states may also be used.

Phase change memory elements may change from the amorphous state to the crystalline state (and vice versa) due to temperature changes of the phase change material. These temperature changes may be caused using different approaches. For example, a current may be driven through the phase change material (or a voltage may be applied across the phase change material). Alternatively, a current or a voltage may be fed to a resistive heater which is disposed adjacent to the phase change material. To determine the memory state of a resistivity changing memory element, a sensing current may be routed through the phase change material (or a sensing voltage may be applied across the phase change material), thereby sensing its resistivity which represents the memory state of the memory element.

Figure 4:
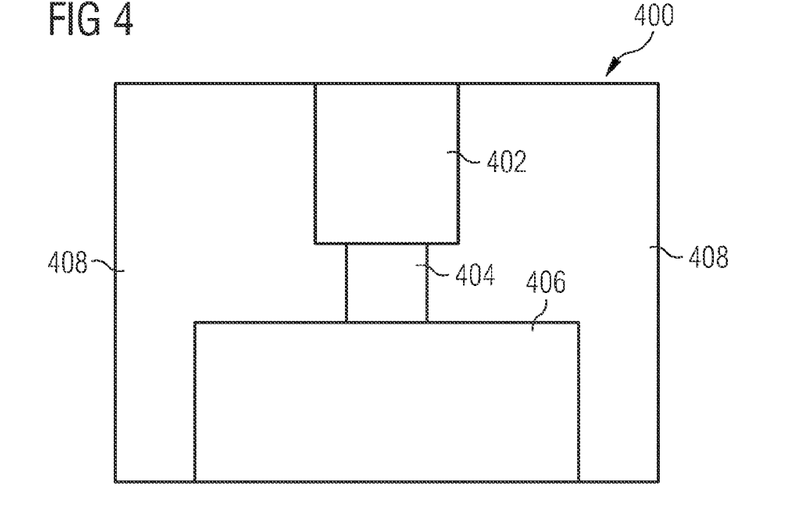
FIG. 4 shows a schematic cross-sectional view of a phase changing memory element.

FIG. 4 illustrates a cross-sectional view of an exemplary phase change memory element 400 (active-in-via type). The phase change memory element 400 includes a first electrode 402, a phase change material 404, a second electrode 406, and an insulating material 408. The phase change material 404 is laterally enclosed by the insulating material 408. To use the phase change memory element, a selection device (not shown), such as a transistor, a diode, or another active device, may be coupled to the first electrode 402 or to the second electrode 406 to control the application of a current or a voltage to the phase change material 404 via the first electrode 402 and/or the second electrode 406. To set the phase change material 404 to the crystalline state, a current pulse and/or voltage pulse may be applied to the phase change material 404, wherein the pulse parameters are chosen such that the phase change material 404 is heated above its crystallization temperature, generally keeping the temperature below the melting temperature of the phase change material 404. To set the phase change material 404 to the amorphous state, a current pulse and/or voltage pulse may be applied to the phase change material 404, wherein the pulse parameters are chosen such that the phase change material 404 is briefly heated above its melting temperature, and is quickly cooled.

The phase change material 404 may include a variety of materials. According to one embodiment, the phase change material 404 may include or consist of a chalcogenide alloy that includes one or more elements from group VI of the periodic table. According to another embodiment, the phase change material 404 may include or consist of a chalcogenide compound material, such as GeSbTe, SbTe, GeTe or AgInSbTe. According to a further embodiment, the phase change material 404 may include or consist of chalcogen free material, such as GeSb, GaSb, InSb, or GeGaInSb. According to still another embodiment, the phase change material 402 may include or consist of any suitable material including one or more of the elements Ge, Sb, Te, Ga, Bi, Pb, Sn, Si, P, O, As, In, Se, and S.

According to one embodiment, at least one of the first electrode 402 and the second electrode 406 may include or consist of Ti, V, Cr, Zr, Nb, Mo, Hf, Ta, W, or mixtures or alloys thereof. According to another embodiment, at least one of the first electrode 402 and the second electrode 406 may include or consist of Ti, V, Cr, Zr, Nb, Mo, Hf, Ta, W and one or more elements selected from the group consisting of B, C, N, O, Al, Si, P, S, and/or mixtures and alloys thereof. Examples of such materials include TiCN, TIAlN, TiSiN, W—$Al_2O_3$ and Cr—$Al_2O_3$.

Figure 5:
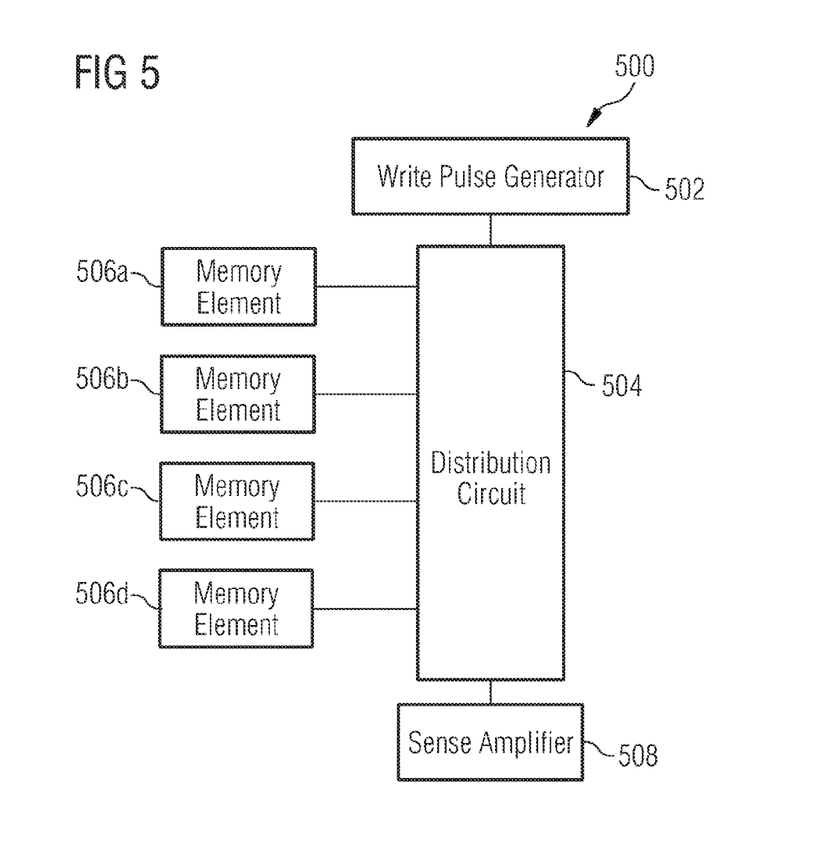
FIG. 5 shows a schematic drawing of an integrated circuit including phase changing memory elements.

FIG. 5 illustrates a block diagram of a memory device 500 including a write pulse generator 502, a distribution circuit 504, phase change memory elements 506a, 506b, 506c, 506d (for example phase change memory elements 400 as shown in FIG. 4), and a sense amplifier 508. According to one embodiment, the write pulse generator 502 generates current pulses or voltage pulses that are supplied to the phase change memory elements 506a, 506b, 506c, 506d via the distribution circuit 504, thereby programming the memory states of the phase change memory elements 506a, 506b, 506c, 506d. According to one embodiment, the distribution circuit 504 includes a plurality of transistors that supply direct current pulses or direct voltage pulses to the phase change memory elements 506a, 506b, 506c, 506d or to heaters being disposed adjacent to the phase change memory elements 506a, 506b, 506c, 506d.

As already indicated, the phase change material of the phase change memory elements 506a, 506b, 506c, 506d may be changed from the amorphous state to the crystalline state (or vice versa) under the influence of a temperature change. More generally, the phase change material may be changed from a first degree of crystallization to a second degree of crystallization (or vice versa) under the influence of a temperature change. For example, a bit value "0" may be assigned to the first (low) degree of crystallization, and a bit value "1" may be assigned to the second (high) degree of crystallization. Since different degrees of crystallization imply different electrical resistances, the sense amplifier 508 is capable of determining the memory state of one of the phase change memory elements 506a, 506b, 506c, or 506d in dependence on the resistance of the phase change material.

To achieve high memory densities, the phase change memory elements 506a, 506b, 506c, 506d may be capable of storing multiple bits of data, i.e., the phase change material may be programmed to more than two resistance values. For example, if a phase change memory element 506a, 506b, 506c, 506d is programmed to one of three possible resistance levels, 1.5 bits of data per memory element can be stored. If the phase change memory element is programmed to one of four possible resistance levels, two bits of data per memory element can be stored, and so on.

The embodiment shown in FIG. 5 may also be applied in a similar manner to other types of resistivity changing memory elements like programmable metallization elements (PMCs), magento-resistive memory elements (e.g., MRAMs), organic memory elements (e.g., ORAMs), or transition metal oxide memory elements (TMOs).

Another type of resistivity changing memory element may be formed using carbon as a resistivity changing material. Generally, amorphous carbon that is rich is $sp^3$-hybridized carbon (i.e., tetrahedrally bonded carbon) has a high resistivity, while amorphous carbon that is rich in $sp^2$-hybridized carbon (i.e., trigonally bonded carbon) has a low resistivity. This difference in resistivity can be used in a resistivity changing memory cell.

In one embodiment, a carbon memory element may be formed in a manner similar to that described above with reference to phase change memory elements. A temperature-induced change between an $sp^3$-rich state and an $sp^2$-rich state may be used to change the resistivity of an amorphous carbon material. These differing resistivities may be used to represent different memory states. For example, a high resistance $sp^3$-rich state can be used to represent a "0", and a low resistance $sp^2$-rich state can be used to represent a "1". It will be understood that intermediate resistance states may be used to represent multiple bits, as discussed above.

Generally, in this type of carbon memory element, application of a first temperature causes a change of high resistivity $sp^3$-rich amorphous carbon to relatively low resistivity $sp^2$-rich amorphous carbon. This conversion can be reversed by application of a second temperature, which is typically higher than the first temperature. As discussed above, these temperatures may be provided, for example, by applying a current and/or voltage pulse to the carbon material. Alternatively, the temperatures can be provided by using a resistive heater that is disposed adjacent to the carbon material.

Another way in which resistivity changes in amorphous carbon can be used to store information is by field-strength induced growth of a conductive path in an insulating amorphous carbon film. For example, applying voltage or current pulses may cause the formation of a conductive $sp^2$ filament in insulating $sp^3$-rich amorphous carbon. The operation of this type of resistive carbon memory is illustrated in FIGS. 6 and 7.

Figure 6:
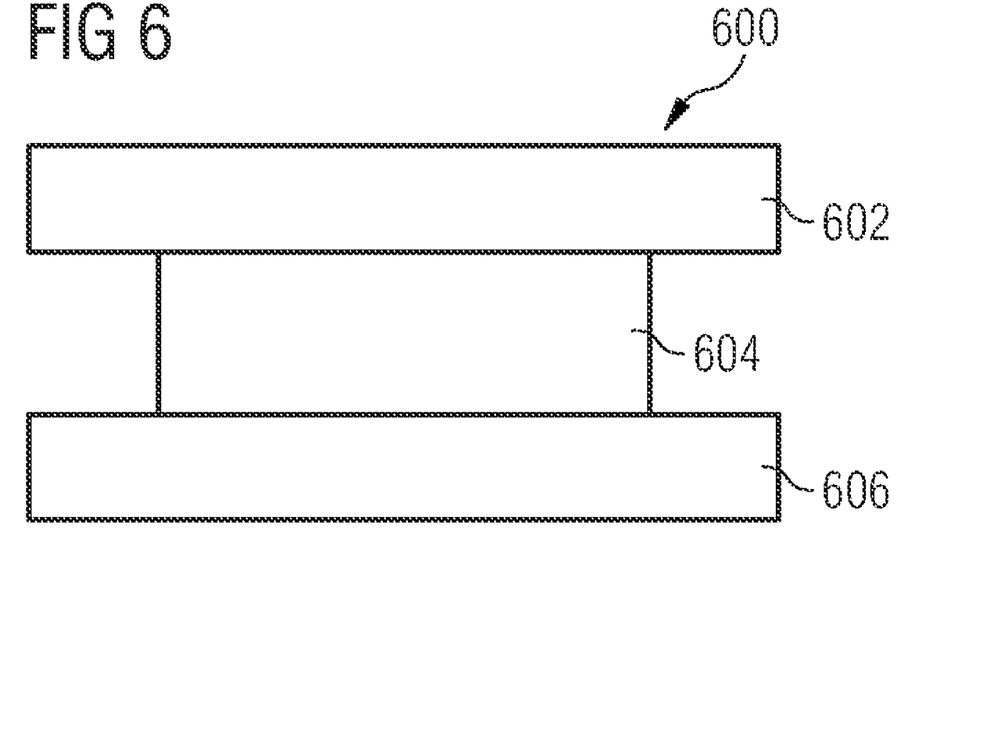
FIG. 6 shows a schematic cross-sectional view of a carbon memory element set to a first switching state.
Figure 7:
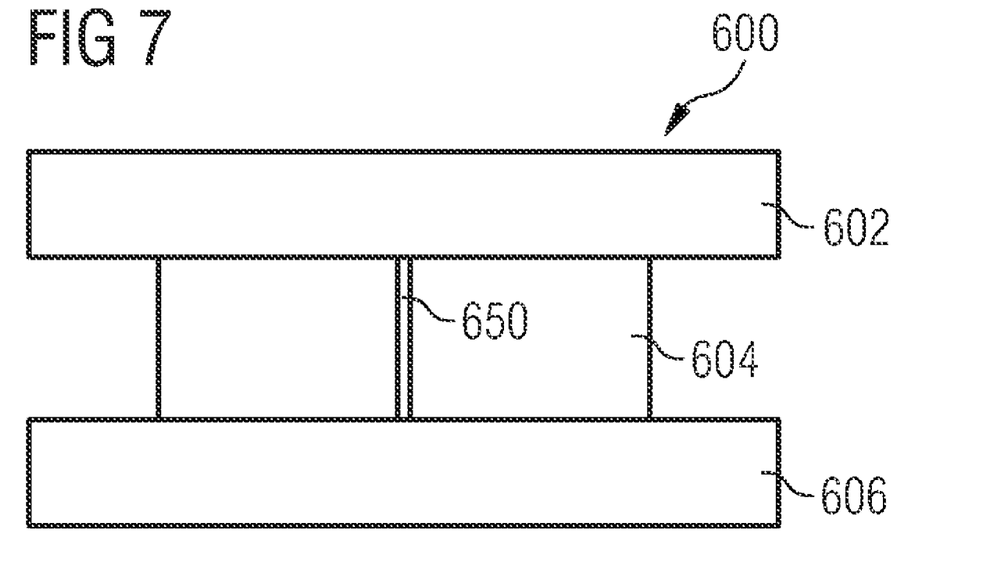
FIG. 7 shows a schematic cross-sectional view of a carbon memory element set to a second switching state.

FIG. 6 shows a carbon memory element 600 that includes a top contact 602, a carbon storage layer 604 including an insulating amorphous carbon material rich in $sp^3$-hybridized carbon atoms, and a bottom contact 606. As shown in FIG. 7, by forcing a current (or voltage) through the carbon storage layer 604, an $sp^2$ filament 650 can be formed in the $sp^3$-rich carbon storage layer 604, changing the resistivity of the memory element. Application of a current (or voltage) pulse with higher energy (or, in some embodiments, reversed polarity) may destroy the $sp^2$ filament 650, increasing the resistance of the carbon storage layer 604. As discussed above, these changes in the resistance of the carbon storage layer 604 can be used to store information, with, for example, a high resistance state representing a "0" and a low resistance state representing a "1". Additionally, in some embodiments, intermediate degrees of filament formation or formation of multiple filaments in the $sp^3$-rich carbon film may be used to provide multiple varying resistivity levels, which may be used to represent multiple bits of information in a carbon memory element. In some embodiments, alternating layers of $sp^3$-rich carbon and $sp^2$-rich carbon may be used to enhance the formation of conductive filaments through the $sp^3$-rich layers, reducing the current and/or voltage that may be used to write a value to this type of carbon memory.

Figure 8:
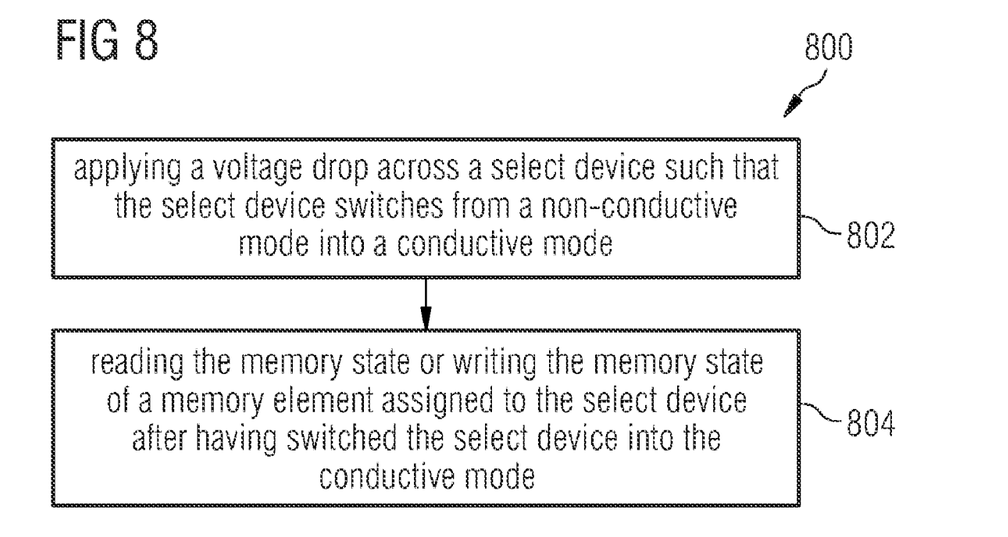
FIG. 8 shows a flowchart of a method of operating an integrated circuit according to one embodiment of the present invention.

FIG. 8 shows a method 800 of operating an integrated circuit according to one embodiment of the present invention. At 802, a voltage drop is applied across a select device such that the select device switches from a non-conductive mode into a conductive mode. At 804, the memory state of a memory element assigned to the select device is read or written after having switched the select device into the conductive mode.

According to one embodiment of the present invention, the select devices are field effect transistor devices or thyristor devices.

According to one embodiment of the present invention, the conductive mode is a punch through mode, a conductive mode after a snap back effect has occurred, or a bipolar mode.

According to one embodiment of the present invention, the integrated circuit includes a plurality of bit lines and a plurality of word lines. Each select device includes a first terminal connected to one of the bit lines via a memory element, a second terminal connecting one of the word lines to the body of the select device, and a third terminal connected to an area of the integrated circuit set to a defined potential, for example, ground potential.

According to one embodiment of the present invention, a select device is switched from the non-conductive mode to the conductive mode by applying a switching voltage between the first terminal and the third terminal, and by setting the voltage of the second terminal to a switching potential.

According to one embodiment of the present invention, after having switched a select device from the non-conductive mode to the conductive mode, the potential of the second terminal may be reduced, e.g., back to a hold potential (the hold-potential is the potential applied to the word lines being connected to non-selected memory cells) without switching the select device back to the non-conductive mode.

According to one embodiment of the present invention, after having switched the select device from the non-conductive mode to the conductive mode, memory cell writing processes may be performed by routing respective memory cell writing currents through the select device, i.e., through the memory element assigned to the select device. Further, memory cell reading processes may be carried out by routing respective reading currents through the select device, i.e., through the memory element assigned to the select device.

According to one embodiment of the present invention, during reading or writing processes, the voltage between the first terminal and the third terminal may be reduced without switching the select device back to the non-conductive mode.

According to one embodiment of the present invention, before carrying out a memory cell writing process or a memory cell reading process regarding a particular memory element, the potential of the floating bodies of a plurality of select devices is changed. According to one embodiment of the present invention, this potential change is carried out before switching the select device assigned to the particular memory element from the non-conductive mode to the conductive mode.

According to one embodiment of the present invention, before carrying out a memory cell writing process or a memory cell reading process regarding a particular memory element, the potential of the floating bodies of all select devices being connected to the same bit line as the particular memory element is changed. According to one embodiment of the present invention, this potential change is carried out before switching the select device assigned to the particular memory element from the non-conductive mode to the conductive mode.

According to one embodiment of the present invention, the potential of the floating bodies is changed by changing the potentials of the first terminals of the select devices. By doing this, the charge within the floating bodies is changed, thereby changing their potentials.

According to one embodiment of the present invention, the potentials of the floating bodies are changed such that parasitic effects occurring within select devices neighboring the particular select device (for example, all select devices which are connected to the same bit line as the particular (selected) select device) can be reduced. For example, it can be prevented that parasitic effects cause neighboring select devices to switch from a non-conductive mode into the conductive mode which is not desirable.

According to one embodiment of the present invention, the potential of the floating bodies is changed by applying a voltage pulse to the first terminals of the select devices.

The voltage pulse may, for example, range between 0.2V to 1V. Further, the voltage pulse may for example have a duration of 0.5 ns to 10 ns.

According to one embodiment of the present invention, the voltage pulse is a negative voltage pulse. This means that the voltage pulse has the opposite amplitude direction, compared to the voltage pulse directions used for switching a select device from a non-conductive mode to the conductive mode. For example, the voltage pulse used to change the potential of the floating bodies may have a negative amplitude, and the voltage pulse used to switch the select device from the non-conductive mode to the conductive mode may have a positive amplitude, or vice versa.

Figure 9:
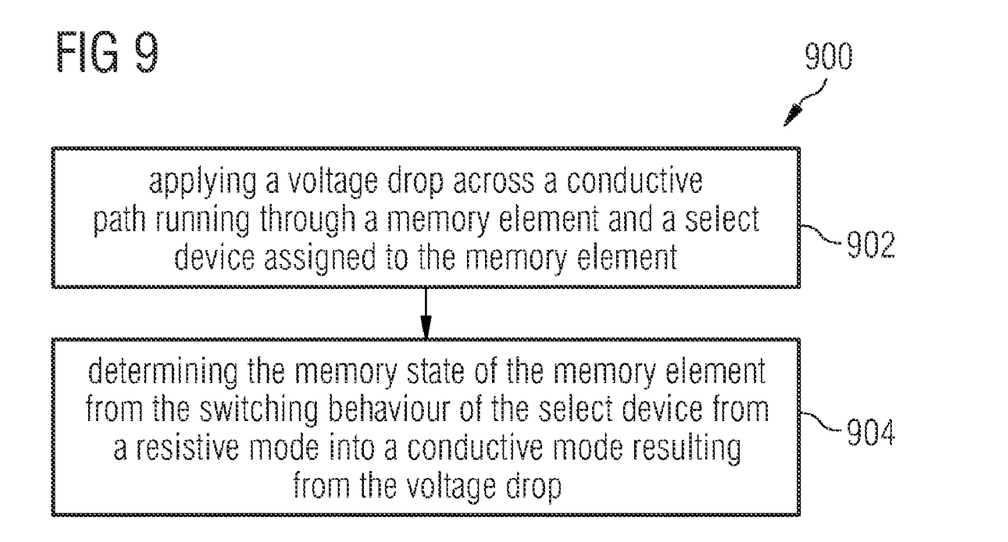
FIG. 9 shows a flowchart of a method of operating an integrated circuit according to one embodiment of the present invention.

FIG. 9 shows a method 900 of operating an integrated circuit according to one embodiment of the present invention. At 902, a voltage drop is applied across a conductive path running through a memory element and a select device assigned to the memory element (here, the term "voltage drop" means a voltage drop over the whole electric component including the memory element and the select device). At 904, the memory state of the memory element is determined from the switching behavior of the select device from a resistive mode into a conductive mode resulting from the voltage drop. In other words, the memory state of the memory element is not determined by routing an additional sensing current through the memory element after having switched the corresponding select device from a non-conductive mode to a conductive mode. Rather, the switching behavior of the select device itself gives an indication of the memory state of the memory element; if the total resistance of memory element resistance and select device resistance lies above a particular resistance threshold value, the voltage drop applied across the conductive path may not be sufficient to switch the select device into the conductive mode. In contrast, if the memory element is in a low resistive mode, the voltage drop across the conductive path may be sufficient to switch the select device from the non-conductive mode into the conductive mode. In this way, the memory state reading process may be accelerated.

According to one embodiment of the present invention, the voltage drop applied across the conductive path ranges from about 0.2V to about 5V. According to one embodiment of the present invention, the voltage drop applied across the conductive path is about 0.2V or about 5V.

According to one embodiment of the present invention, the voltage drop applied across the conductive path ranges from about 0.7V to about 3V. According to one embodiment of the present invention, the voltage drop applied across the conductive path is about 0.7V or about 3V.

All embodiments discussed in conjunction with FIG. 8 may also be applied, if applicable, to the embodiments discussed in conjunction with FIG. 9.

Figure 10:
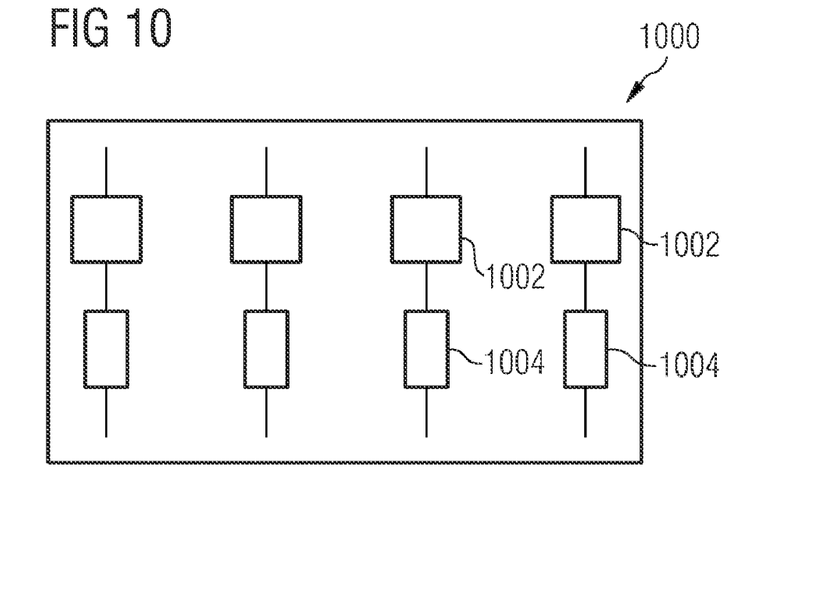
FIG. 10 shows a schematic drawing of an integrated circuit according to one embodiment of the present invention.

FIG. 10 shows an integrated circuit 1000 according to one embodiment of the present invention. The integrated circuit 1000 includes a plurality of resistivity changing memory elements 1002 and a plurality of memory element select devices 1004. The select devices 1004 are floating body select devices.

According to one embodiment of the present invention, the select devices 1004 are MOSFET devices or thyristor devices.

Figure 11:
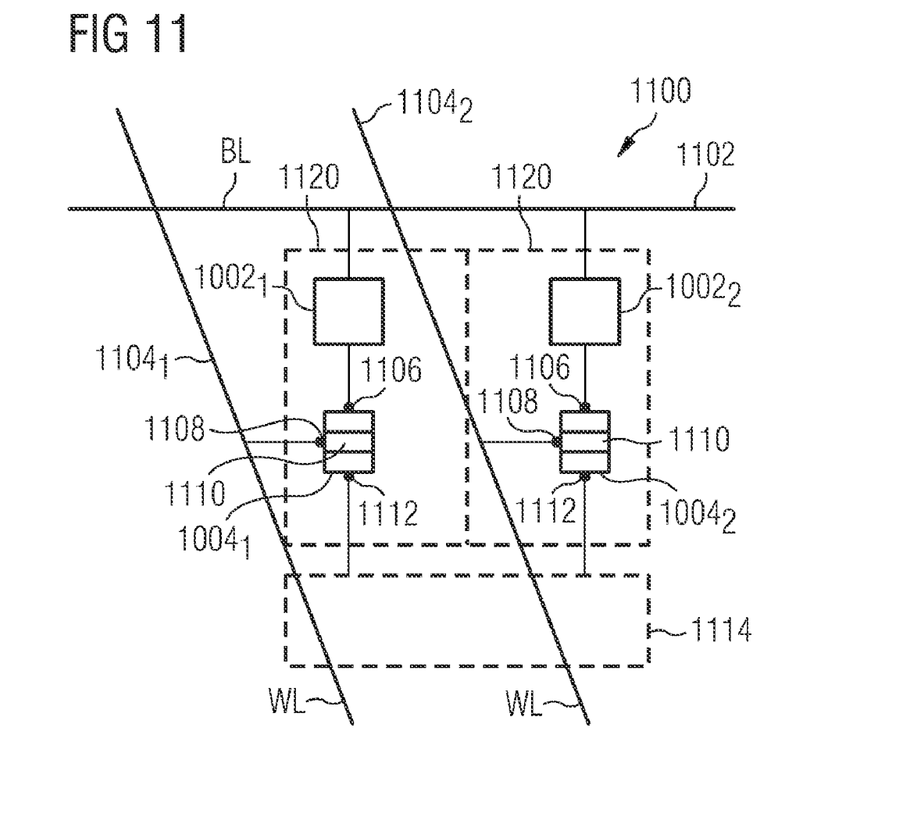
FIG. 11 shows a schematic drawing of an integrated circuit according to one embodiment of the present invention.

FIG. 11 shows an integrated circuit 1100 according to one embodiment of the present invention. The integrated circuit 1100 includes a plurality of memory elements 1002 and a plurality of select devices 1004. The integrated circuit 1100 further includes a plurality of bit lines 1102 and a plurality of word lines 1 104. Each select device 1004 includes a first terminal 1106 connected to one of the bit lines 1102 via a memory element 1002, a second terminal 1108 connected to one of the word lines 1104 and to the body 1110 of the select device 1004, and a third terminal 1112 connected to an area 1114 of the integrated circuit 1100 set to a defined potential. The area 1114 set to a defined potential may for example, be an area of a grounded semiconductor substrate shared by all memory cells 1120 of the integrated circuit 1100.

It is to be understood that the second terminals 1108 may be directly connected to the bodies 1110 of the select devices 1004. However, the term "connected to the body" may also mean that the second terminal 1108 is connected to an electrode which is provided on the body 1110, however is electrically isolated against the body 1110 by an isolation layer (which may, for example, be the case if the select device 1004 is a MOSFET device).

According to one embodiment of the present invention, each select device 1004 can be switched between a conductive mode and a non-conductive mode by applying a switching voltage between the first terminal 1106 and the third terminal 1112, and by setting the voltage of the second terminal 1108 to a switching potential. By switching the select device 1004 into the conductive mode, the memory element 1002 assigned to the select device 1004 is selected.

One effect of using floating body select devices is that no low ohmic connection has to be provided between the body 1110 of the select device 1004 and any other terminal providing a fixed potential if the select device 1004 is in the non-conductive mode. Such a low ohmic connection to, e.g. the third terminal 1112 of the select device or to a further/additional terminal as for example the substrate is normally required for non-floating body select devices. However, such low ohmic connections complicate the manufacturing process of the integrated circuit and may also increase the size of the integrated circuit (more chip area is needed).

According to one embodiment of the present invention, the conductive mode may be a punch through mode. However, also other types of conductive modes are possible, as, for example, a kindled mode or a conductive mode after a snap back effect has occurred.

Figure 13:
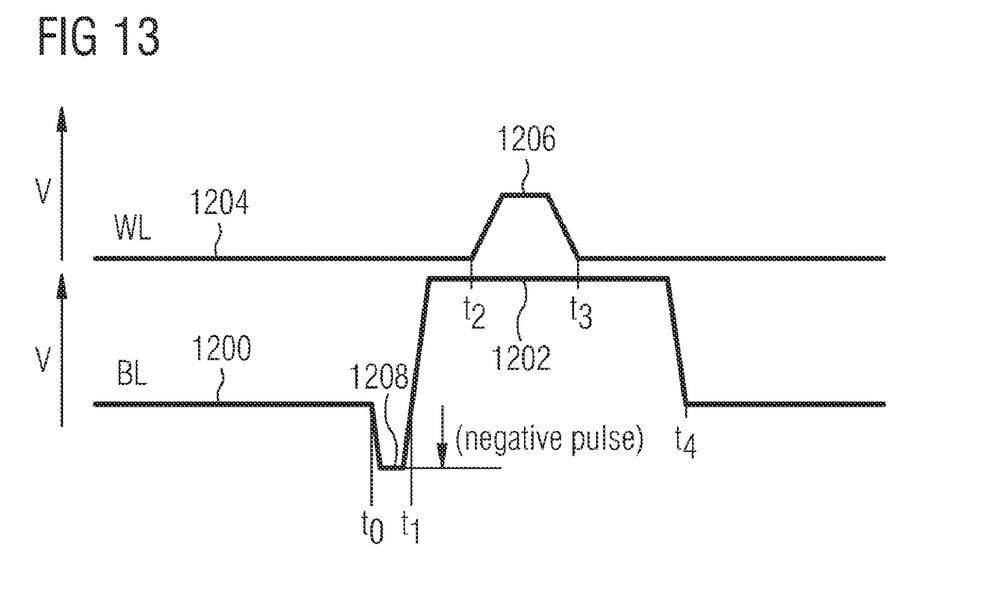
FIG. 13 shows voltages used in order to operate an integrated circuit according to one embodiment of the present invention.

According to one embodiment of the present invention, the integrated circuit 1100 includes circuitry which adjusts, before carrying out a memory element writing process regarding a particular memory element (i.e., before selecting the memory element), the potentials of the floating bodies 1110 of select devices 1004 connected to the same bit line 1102 as the particular memory element by supplying an adjusting potential to the first terminals 1108 of the select devices 1004 connected to the same bit line 1102, as will, for example, be explained later in conjunction with FIG. 13. One effect of this embodiment is that parasitic effects occurring within select devices connected to the same bit line 1102 as the particular memory element can be avoided.

According to one embodiment of the present invention, the integrated circuit 1100 has a SOI (silicon on insulator) architecture.

According to one embodiment of the present invention, the resistivity changing memory elements are phase changing memory elements.

According to one embodiment of the present invention, the resistivity changing memory elements are programmable metallization memory elements.

Figure 12:
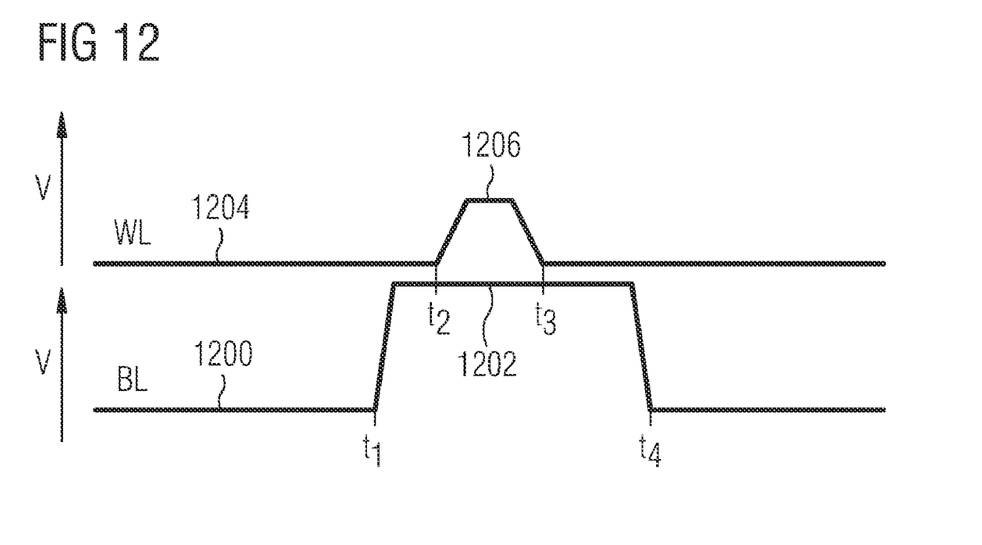
FIG. 12 shows voltages used in order to operate an integrated circuit according to one embodiment of the present invention.

FIG. 12 shows an example of a method of operating the integrated circuit 1100. In order to write a memory state into the memory element $1002_2$, the voltage of the bit line 1102 is set from a first voltage value 1200 to a second voltage value 1202 at a time instance $t_1$. It is assumed here that the area 1114 is set to a fixed potential. Thus, the same voltage drop is supplied across each select device 1004 which is connected to the same bit line 1102. Then, at time instance $t_2$, the voltage of the word line $1104_2$ is set from a first voltage value 1204 to a second voltage value 1206. As a consequence, the select device $1004_2$ switches from the non-conductive mode into the conductive mode, and a programming current flows through the memory element $1002_2$, thereby programming the memory element $1002_2$. At a time instance $t_3$, the voltage on the word line $1104_2$ drops again to the first voltage value 1204. Further, at time instance $t_4$, the voltage value at the bit line 1102 drops from the second voltage value 1202 again to the first voltage value 1200.

The time duration between the first time instance $t_1$ and the fourth time instance $t_4$ may, for example, range between about 1 ns and about 1000 ns. The voltage difference between the first voltage value 1200 and the second voltage value 1202 may, for example, range between 0.2V and 5V during a memory state writing process. Good results have been achieved using a range between 1V and 5V during a memory state writing process. During a memory state reading process, the voltage difference between the first voltage value 1200 and the second voltage value 1202 may, for example, range between 0.2V and 5V. Good results have been achieved using a range between 0.2V and 0.5V during a memory state reading process. The voltage difference between the first voltage value 1204 and the second voltage value 1206 may, for example, range between 0.5V and 2V during a memory state writing or reading process.

FIG. 13 shows voltages used to operate an integrated circuit according to a further embodiment of the present invention. The voltages used are similar to that shown in FIG. 12. However, additionally, before time instance $t_1$, at time instance $t_0$, the voltage occurring on the bit line 1102 drops from the first voltage 1200 to a third voltage 1208. Then, at time instance $t_1$, the voltage changes from the third voltage 1208 to the second voltage 1202. The voltage pulse applied between time instance $t_0$ and $t_1$ may, for example, have a duration of about 100 ps to about 100 ns and a strength of 0.2V to 5V. According to one embodiment of the present invention, the voltage difference between the first voltage 1200 and the third voltage 1208 may, for example, range between 0.2V and 2V (good results). Good results have in particular been achieved using a voltage difference between the first voltage 1200 and the third voltage 1208 which ranges between 0.2V and 1V. The time period between time instance $t_0$ and $t_1$ may, for example, range between 0.5 ns and 10 ns.

Here, the voltage pulse applied between time instance $t_0$ and $t_1$ is a negative voltage pulse. This means that the voltage pulse has the opposite amplitude direction, compared to the voltage pulse directions (positive) used for switching a select device from a non-conductive mode to the conductive mode.

The use of a third voltage 1208 which is lower than the first voltage 1200 effects that the potentials of the floating bodies 1110 of all select devices 1004 connected to the same bit line 1112 as the select device 1004$_2$ are manipulated (e.g., lowered) in a way that during the memory state writing process of the memory element 1002$_2$ no parasitic effect occur within select devices other than the select device 1004$_2$. For example, it can be prevented that the select device 1004$_1$ switches from the non-conductive mode into the conductive mode.

Figure 14A:
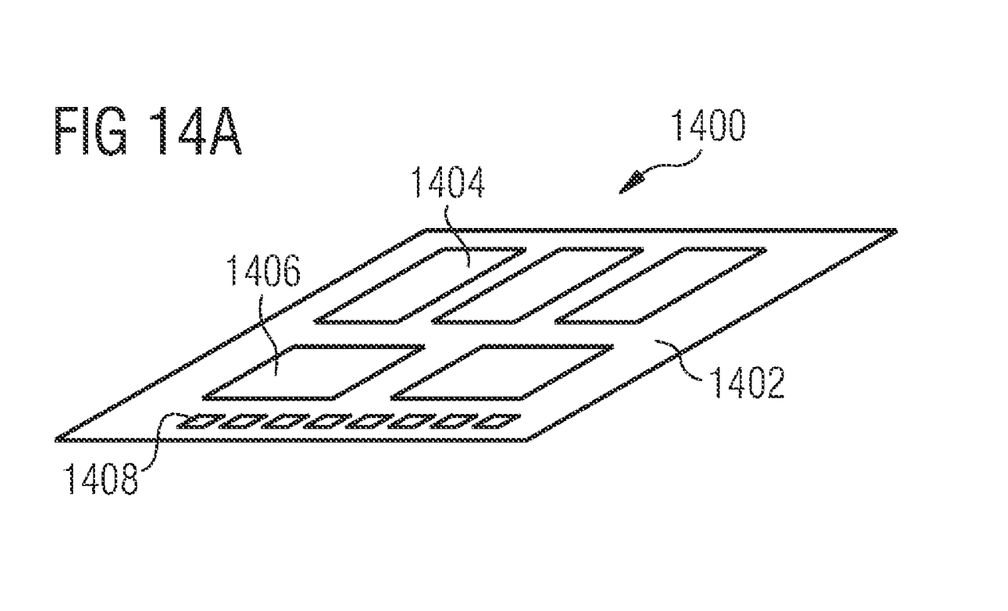
FIG. 14A shows a schematic perspective view of a memory module according to one embodiment of the present invention.
Figure 14B:
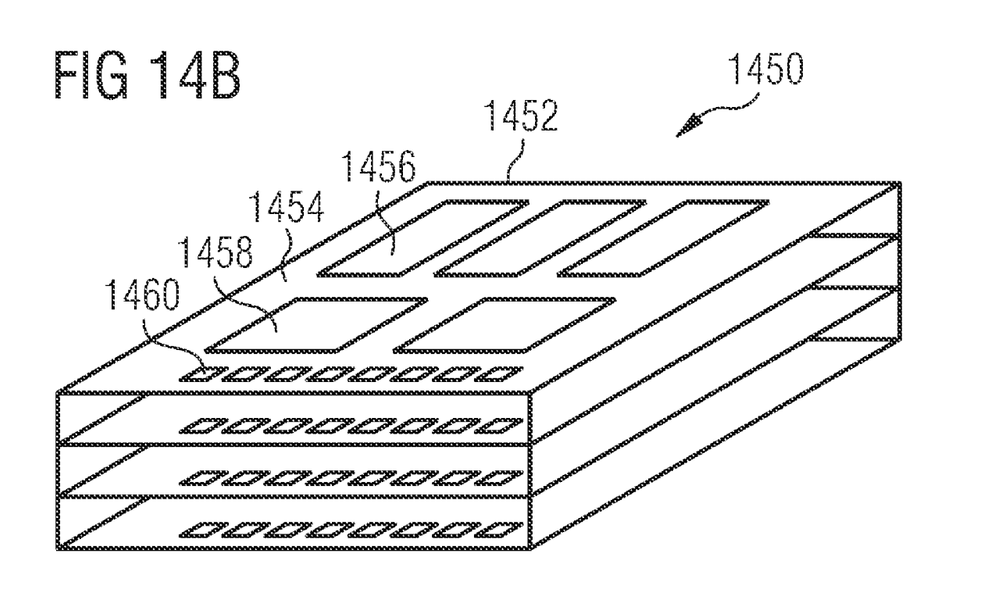
FIG. 14B shows a schematic perspective view of a memory module according to one embodiment of the present invention.

As shown in FIGS. 14A and 14B, in some embodiments, integrated circuits such as those described herein may be used in modules. In FIG. 14A, a memory module 1400 is shown, on which one or more integrated circuits 1404 are arranged on a substrate 1402. The integrated circuits 1404 include numerous memory cells. The memory module 1400 may also include one or more electronic devices 1406, which may include memory, processing circuitry, control circuitry, addressing circuitry, bus interconnection circuitry, or other circuitry or electronic devices that may be combined on a module with a memory device, such as the integrated circuits 1404. Additionally, the memory module 1400 includes multiple electrical connections 1408, which may be used to connect the memory module 1400 to other electronic components, including other modules.

As shown in FIG. 14B, in some embodiments, these modules may be stackable, to form a stack 1450. For example, a stackable memory module 1452 may contain one or more integrated circuits 1456, arranged on a stackable substrate 1454. The integrated circuits 1456 contain memory cells. The stackable memory module 1452 may also include one or more electronic devices 1458, which may include memory, processing circuitry, control circuitry, addressing circuitry, bus interconnection circuitry, or other circuitry or electronic devices that may be combined on a module with a memory device, such as the integrated circuits 1456. Electrical connections 1460 are used to connect the stackable memory module 1452 with other modules in the stack 1450, or with other electronic devices. Other modules in the stack 1450 may include additional stackable memory modules, similar to the stackable memory module 1452 described above, or other types of stackable modules, such as stackable processing modules, control modules, communication modules, or other modules containing electronic components.

In the following description, further aspects of exemplary embodiments of the present invention will be explained.

To be cost competitive, a small cell size is required for PCRAM devices or other resistive memory cell devices. With a planar array transistor, or with a transistor where the source/drain contacts are lying in the same horizontal plane (for example, FinFET), the cell size for a 1T1R cell is limited to 6F2 (F being the smallest feature size) for geometrical reasons.

In order to go below 6F2 for a 1T1R cell, an array FET with vertical current flow may be used, because this allows the use of a buried ground plate.

Several array architectures may be used for sub-6F2 memory cells with a vertical surrounding gate or double gate transistor, featuring a buried diffused ground plate in the silicon substrate.

If a body contact has to be established to each cell, the buried ground plate has to have a mesh-like arrangement, increasing manufacturing difficulty and increasing achievable ground plate resistance.

For a floating body cell, it should be ensured that there are no parasitic leakages and punch-through of the select device due to the floating voltage of the select device body.

MOSFETs may be used as access devices for resistive memory cells, which suffer from the limited current drive capability, especially when scaling the devices to smaller ground rules.

Also diodes may be used as access devices. The drawback of this approach is the high voltage drop over the device even under forward biased condition. One further approach is the usage of bipolar transistors, featuring a low emitter-collector voltage drop in forward biased condition and a high current drive. The problem of using bipolar devices is the integration into small cells i.e., $4F^2$ cells.

According to one embodiment of the present invention, the problem of limited current drive capability is avoided by using floating body devices in punch-through mode as access devices. For example, the access devices (also referred to as select devices) could be floating body MOSFETs or thyristor structures with floating p- and/or n-regions. The access device may be connected, for example, between a ground plate and the resistive element. The resistive element (memory element) in turn may be connected between the access device and the BL.

According to one embodiment of the present invention, the device is turned on by applying a sufficient high voltage between the ground plate and the bit line (BL). The selection of only one select device per bit line can be done by applying an adequate signal to the word line (WL), i.e., a voltage pulse, which ignites the select device (e.g., thyristor) or the punch-through of the floating body device.

Due to the floating body, accumulation of charge in the body during hold time and thus parasitic punch through of the access device is likely. Therefore, the drain of the floating body device may be biased negatively for a short period of time in order to pull down the floating body potential by a forward-biased junction. This operation may be combined with a writing/reading cycle of the cell, because in this case the body potential is critical in order to avoid punch-through of the device (at high voltages).

Effects of embodiments of the present invention are as follows.

Both conventional substrates and SOI substrates, and both planar (SOI) and vertical MOSFET select devices may be used. Both floating body select devices and weakly connected body select devices can be used. According to one embodiment of the present invention, the term "weakly connected" may mean a connection via a depleted silicon region.

The embodiments of the present invention do not need periodic refreshes. "Refreshes" (body potential changes) may only be used for bit lines prior to write or read processes to eliminate cell history. In this way, the problem of parasitic leakages or punch throughs is solved by applying BL-low-pulses prior each writing/reading action in order to eliminate cell history.

Within the scope of the present invention, the terms "connecting" and "coupling" may both mean direct and indirect connecting and coupling, respectively.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit, comprising:
   a plurality of resistivity changing memory elements,
   a plurality of bit lines and a plurality of word lines,
   a plurality of select devices, wherein each select device comprises a floating body select device,
      wherein each select device comprises a first terminal coupled to one of the bit lines via a memory element, a second terminal coupled to one of the word lines and to the body of the select device, and a third terminal coupled to an area of the integrated circuit set to a defined potential, and
   circuitry that adjusts, before carrying out a memory element writing or reading processes, potentials of floating bodies of all the select devices connected to the same bit line by setting the first terminals of the select devices coupled to the same bit line to an adjusting potential.

2. The integrated circuit according to claim 1, wherein the select devices comprise field effect transistor devices or thyristor devices.

3. The integrated circuit according to claim 1, wherein each select device can be switched from a non-conductive mode to a conductive mode by applying a switching voltage between the first terminal and the third terminal, and by setting a voltage of the second terminal to a switching potential.

4. The integrated circuit according to claim 3, wherein the conductive mode is a punch through mode, a conductive mode after a snap back effect has occurred, or a bipolar mode.

5. The integrated circuit according to claim 1, wherein the integrated circuit has a SOI architecture.

6. The integrated circuit according to claim 1, wherein the resistivity changing memory elements comprise phase changing memory elements.

7. The integrated circuit according to claim 1, wherein the resistivity changing memory elements comprise magnetoresistive memory elements.

8. The integrated circuit according to claim 1, wherein the resistivity changing memory elements comprise programmable metallization memory elements.

9. A memory module comprising at least one integrated circuit comprising:
   a plurality of resistivity changing memory elements,
   a plurality of bit lines and a plurality of word lines,
   a plurality of select devices, wherein each select device comprises a floating body select device,
      wherein each select device comprises a first terminal coupled to one of the bit lines via a memory element, a second terminal coupled to one of the word lines and to the body of the select device, and a third terminal coupled to an area of the integrated circuit set to a defined potential, and
   circuitry that adjusts, before carrying out a memory element writing or reading processes, potentials of floating bodies of all the select devices connected to the same bit line by setting the first terminals of the select devices coupled to the same bit line to an adjusting potential.

10. The memory module according to claim 9, wherein the memory module is stackable.

11. A method of operating an integrated circuit comprising a plurality of resistivity changing memory elements, a plurality of bit lines, a plurality of word lines and a plurality of memory element select devices, the select devices being floating body select devices, the method comprising:
   changing the potential of the floating bodies of all select devices being coupled to the same bit line,
   applying a voltage drop across a select device such that the select device switches from a non-conductive mode into a conductive mode; and
   reading a memory state or writing a memory state of a memory element assigned to the select device after having switched the select device into the conductive mode;
   wherein each select device comprises a first terminal coupled to one of the bit lines via a memory element, a second terminal coupled to one of the word lines and to the body of the select device, and a third terminal coupled to an area of the integrated circuit set to a defined potential.

12. The method according to claim 11, wherein the select devices comprise field effect transistor devices or thyristor devices.

13. The method according to claim 11, wherein the conductive mode is a punch through mode, a conductive mode after a snap back effect has occurred, or a bipolar mode.

14. The method according to claim 11, wherein a select device is switched from the non-conductive mode to the conductive mode by applying a switching voltage between the first terminal and the third terminal, and by setting the voltage of the second terminal to a switching potential.

15. The method according to claim 14, wherein, after having switched the select device from the non-conductive mode to the conductive mode, the voltage of the second terminal is reduced back to a hold potential without switching the select device back to the non-conductive mode.

16. The method according to claim 11, wherein the potential of the floating bodies is changed by changing potentials of the first terminals of the select devices.

17. The method according to claim 16, wherein the potential of the floating bodies is changed by applying a voltage pulse to the first terminals of the select devices.

18. The method according to claim 17, wherein the voltage pulse has a duration of 100 ps to 100 ns and a strength of 0.2V to 2V.

19. A method of operating an integrated circuit comprising a plurality of resistivity changing memory elements, a plurality of bit lines, a plurality of word lines and a plurality of memory element select devices, the select devices being floating body select devices, the method comprising:
   changing the potential of the floating bodies of all select devices being coupled to the same bit line,
   applying a voltage drop across a conductive path running through a memory element and a select device assigned to the memory element,
   determining a memory state of the memory element from a switching behavior of the select device from a resistive mode into a conductive mode resulting from the voltage drop,
   wherein each select device comprises a first terminal coupled to one of the bit lines via a memory element, a second terminal coupled to one of the word lines and to the body of the select device, and a third terminal coupled to an area of the integrated circuit set to a defined potential.

20. The method according to claim 19, wherein the voltage drop applied across the conductive path is about 0.2V to 5V.

* * * * *